(12) United States Patent
Nakamura et al.

(10) Patent No.: US 11,923,854 B2
(45) Date of Patent: Mar. 5, 2024

(54) LOGIC CIRCUIT

(71) Applicant: CANON KABUSHIKI KAISHA, Tokyo (JP)

(72) Inventors: Kohichi Nakamura, Kanagawa (JP); Yasuhiro Oguro, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 115 days.

(21) Appl. No.: 17/718,350

(22) Filed: Apr. 12, 2022

(65) Prior Publication Data
US 2022/0337230 A1    Oct. 20, 2022

(30) Foreign Application Priority Data

Apr. 16, 2021 (JP) .................................. 2021-069623

(51) Int. Cl.
| | |
|---|---|
| *H03K 3/037* | (2006.01) |
| *G06T 7/55* | (2017.01) |
| *H04N 25/71* | (2023.01) |
| *H03L 7/08* | (2006.01) |
| *H03M 9/00* | (2006.01) |

(52) U.S. Cl.
CPC .............. *H03K 3/037* (2013.01); *G06T 7/55* (2017.01); *H04N 25/745* (2023.01); *G06T 2207/30252* (2013.01); *H03L 7/08* (2013.01); *H03M 9/00* (2013.01)

(58) Field of Classification Search
CPC . H03K 3/037; G06T 7/55; G06T 2207/30252; H04N 25/745; H03L 7/08; H03L 7/18; H03M 9/00
USPC ....................................................... 331/177 R
See application file for complete search history.

(56) References Cited

U.S. PATENT DOCUMENTS

| | | | | |
|---|---|---|---|---|
| 7,453,294 | B1 * | 11/2008 | Wang ...................... | H03K 3/012 327/212 |
| 10,326,955 | B1 * | 6/2019 | Lin ........................ | H04N 25/709 |
| 2015/0326255 | A1 * | 11/2015 | Dally ....................... | H03K 3/45 375/297 |
| 2019/0007034 | A1 * | 1/2019 | Nakai ................... | H03K 5/1252 |

FOREIGN PATENT DOCUMENTS

| | | |
|---|---|---|
| JP | 2017-181463 A | 10/2017 |
| JP | 2019-12944 A | 1/2019 |
| JP | 2019-220856 A | 12/2019 |

* cited by examiner

*Primary Examiner* — Richard Tan
(74) *Attorney, Agent, or Firm* — VENABLE LLP

(57) ABSTRACT

Provided is a logic circuit including a first circuit including a static D flip-flop and a second circuit including a dynamic D flip-flop. The first circuit receives a clock signal and a first reset signal. The first circuit outputs a second reset signal generated by synchronizing the first reset signal with the clock signal. The second circuit receives the clock signal and a signal based on the second reset signal.

14 Claims, 12 Drawing Sheets

US 11,923,854 B2

LOGIC CIRCUIT

BACKGROUND OF THE INVENTION

Field of the Invention

The present disclosure relates to a logic circuit.

Description of the Related Art

A D flip-flop is applied to various logic circuits. Japanese Patent Application Laid-Open No. 2019-12944 discloses a clock signal generation circuit including a ring counter. The ring counter includes cascade-connected three D flip-flops. The output signal of the third stage D flip-flop is input to the input terminal of the first stage D flip-flop, and the three D flip-flops form a ring shape.

In a logic circuit including a D flip-flop such as the ring counter described in Japanese Patent Application Laid-Open No. 2019-12944, there is a demand for high-speed operation and reduction of malfunction.

SUMMARY OF THE INVENTION

The present disclosure has been made in view of the above-described problems, and an object of the present disclosure is to provide a logic circuit in which high-speed operation and reduction of malfunction are realized.

According to an aspect of the present disclosure, there is provided a logic circuit including a first circuit including a static D flip-flop and a second circuit including a dynamic D flip-flop. The first circuit receives a clock signal and a first reset signal. The first circuit outputs a second reset signal generated by synchronizing the first reset signal with the clock signal. The second circuit receives the clock signal and a signal based on the second reset signal.

Further features of the present invention will become apparent from the following description of exemplary embodiments with reference to the attached drawings.

DESCRIPTION OF THE EMBODIMENTS

Figure 1:
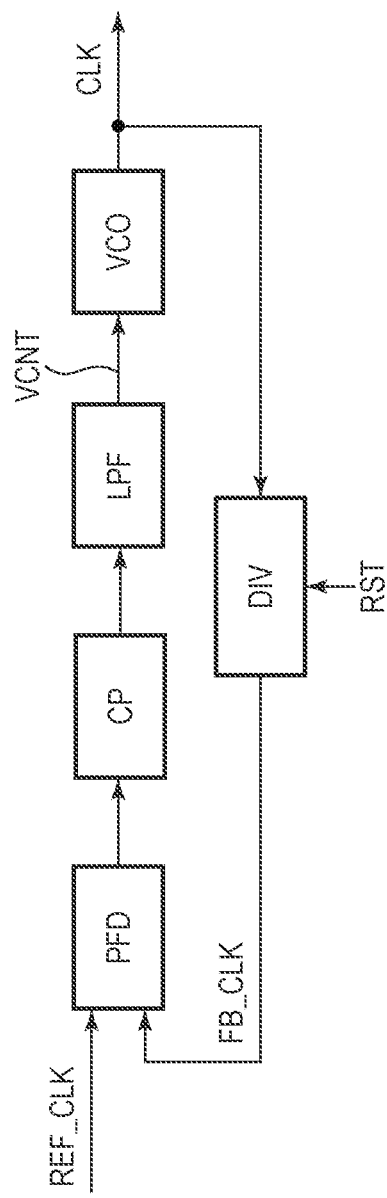
FIG. 1 is a block diagram illustrating a schematic configuration of a PLL including a frequency dividing circuit according to a first embodiment.

Preferred embodiments of the present invention will now be described in detail in accordance with the accompanying drawings. In the drawings, the same or corresponding elements are denoted by the same reference numerals, and the description thereof may be omitted or simplified.

First Embodiment

In the present embodiment, a frequency dividing circuit, which is an example of a logic circuit to which the present invention can be applied, and a phase locked loop (PLL) including the frequency dividing circuit will be described. FIG. 1 is a block diagram illustrating a schematic configuration of a PLL including a frequency dividing circuit according to the present embodiment. The PLL includes a phase frequency detector PFD, a charge pump CP, a low-pass filter LPF, a voltage controlled oscillator VCO, and a frequency dividing circuit DIV.

A reference clock signal REF_CLK from the outside and a feedback clock signal FB_CLK from the frequency dividing circuit DIV are input to the phase frequency detector PFD. The phase frequency detector PFD detects a phase difference and a frequency difference between the reference clock signal REF_CLK and the feedback clock signal FB_CLK.

The charge pump CP outputs the control voltage VCNT corresponding to the detected phase difference to the voltage controlled oscillator VCO via the low-pass filter LPF. The low-pass filter LPF reduces an AC component of a voltage signal output from the charge pump CP. The voltage controlled oscillator VCO oscillates at a frequency corresponding to the control voltage VCNT and outputs a clock signal CLK having a frequency corresponding to the control voltage VCNT.

The clock signal CLK is input to the frequency dividing circuit DIV. The frequency dividing circuit DIV divides the frequency of the input clock signal CLK by N (N is a positive integer) to generate a feedback clock signal FB_CLK. The feedback clock signal FB_CLK is fed back to the phase frequency detector PFD. A reset signal RST for resetting the frequency dividing circuit DIV is externally input to the frequency dividing circuit DIV.

The PLL performs feedback control so that the phase difference between the reference clock signal REF_CLK and the feedback clock signal FB_CLK obtained by dividing the output of the voltage controlled oscillator VCO is constant. Thus, the PLL outputs the clock signal CLK synchronized with the reference clock signal REF_CLK. Further, since the frequency dividing circuit DIV divides the frequency of the clock signal CLK by N at the time of feedback, the frequency of the clock signal CLK is N times the frequency of the reference clock signal REF_CLK.

Figure 2:
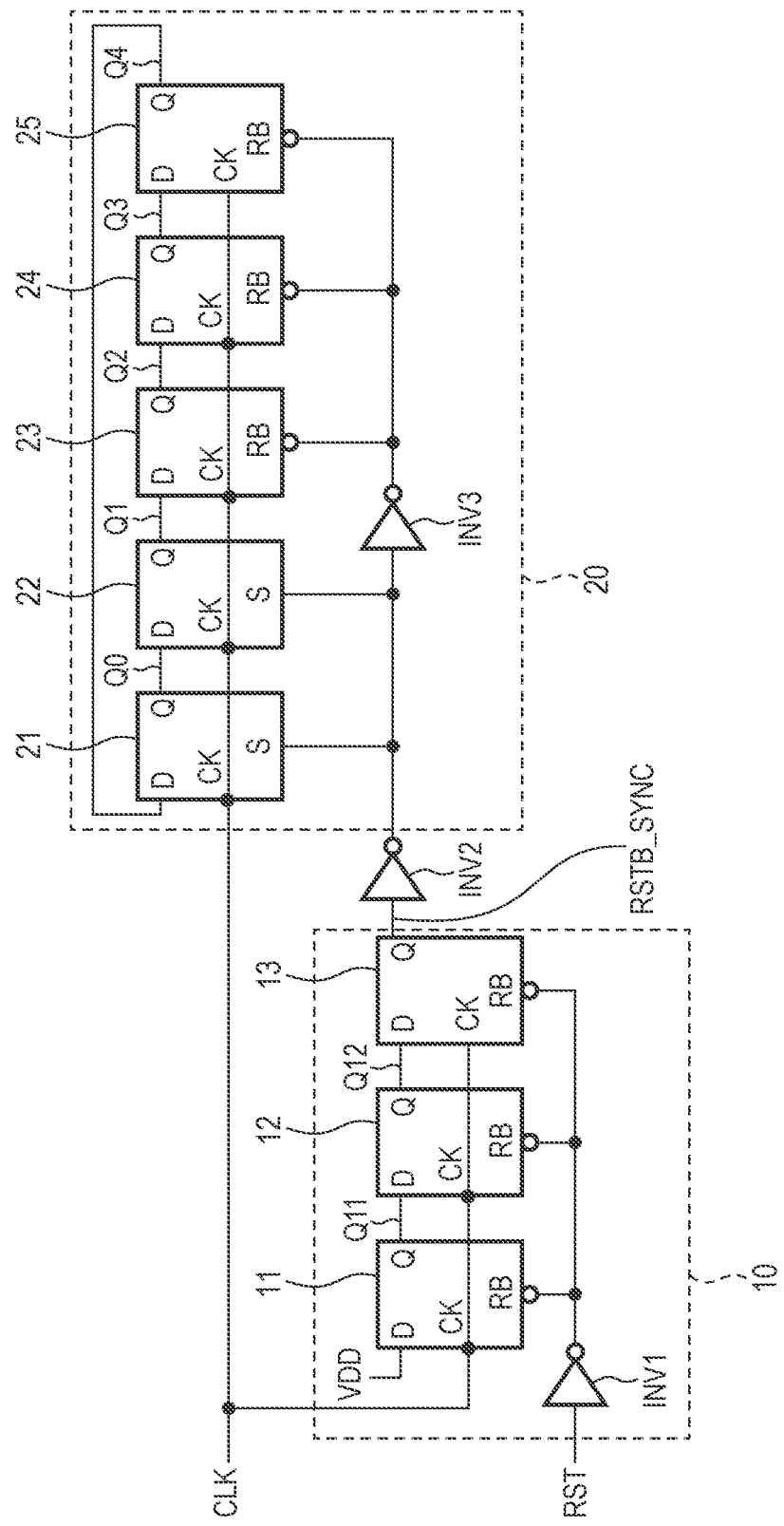
FIG. 2 is a circuit diagram illustrating a configuration of a frequency dividing circuit according to the first embodiment.

Next, an example of the configuration of the frequency dividing circuit DIV will be described in more detail. FIG. 2 is a circuit diagram illustrating a configuration of the frequency dividing circuit DIV according to the present embodiment. The frequency dividing circuit DIV includes a reset synchronization unit 10, a frequency dividing unit 20, and an inverter INV2. A clock signal CLK from the voltage controlled oscillator VCO is input to the reset synchronization unit 10 and the frequency dividing unit 20. The reset signal RST is input to the reset synchronization unit 10 from the outside.

The reset synchronization unit 10 (first circuit) is a circuit that generates and outputs a reset synchronization signal RSTB_SYNC (second reset signal) by synchronizing a reset signal RST (first reset signal) input from the outside with a clock signal. The reset synchronization unit 10 includes three static D flip-flops 11, 12 and 13 which are cascade-connected and an inverter INV1. Hereinafter, the static D flip-flop may be referred to as ST_DFF. Each of the ST_DFFs 11, 12, and 13 has an input terminal D, an output terminal Q, a clock terminal CK, and a reset terminal RB.

The clock signal CLK is input to the clock terminals CK of the ST_DFFs 11, 12, and 13. An input terminal D of the ST_DFF 11 is connected to a power supply line VDD having a high-level power supply potential. The output terminal Q of the ST_DFF 11 is connected to the input terminal D of the ST_DFF 12. The output terminal Q of the ST_DFF 12 is connected to the input terminal D of the ST_DFF 13. An output terminal Q of the ST_DFF 13 is an output terminal of the reset synchronization unit 10, and is connected to an input terminal of the inverter INV2. The output signals of the output terminals Q of the ST_DFFs 11 and 12 may be referred to as Q11 and Q12, respectively.

The reset signal RST is input to an input terminal of the inverter INV1. An output terminal of the inverter INV1 is connected to the reset terminals RB of the ST_DFFs 11, 12, and 13. When the level of the reset signal RST is high, this signal is inverted by the inverter INV1, and a low-level signal is input to the reset terminals RB of the ST_DFFs 11, 12, and 13. At this time, the level of the output terminal Q of each of the ST_DFFs 11, 12, and 13 is reset to the low level.

The frequency dividing unit 20 (second circuit) is a circuit for dividing the frequency of the clock signal CLK by five by receiving the clock signal CLK and a signal based on the reset synchronization signal RSTB_SYNC. The frequency dividing unit 20 includes cascade-connected five dynamic D flip-flops 21, 22, 23, 24, and 25 and an inverter INV3. Hereinafter, the dynamic D flip-flop may be referred to as D_DFF. Each of the D_DFFs 21 and 22 has an input terminal D, an output terminal Q, a clock terminal CK, and a set terminal S. Each of the D_DFFs 23, 24, and 25 has an input terminal D, an output terminal Q, a clock terminal CK, and a reset terminal RB.

A clock signal CLK is input to the clock terminals CK of the D_DFFs 21, 22, 23, 24, and 25. The output terminal Q of the D_DFF 21 is connected to the input terminal D of the D_DFF 22, and the output terminal Q of the D_DFF 22 is connected to the input terminal D of the D_DFF 23. The output terminal Q of the D_DFF 23 is connected to the input terminal D of the D_DFF 24, and the output terminal Q of the D_DFF 24 is connected to the input terminal D of the D_DFF 25. The output terminal Q of the D_DFF 25 is connected to the input terminal D of the D_DFF 21. Thus, the D_DFFs 21, 22, 23, 24, and 25 constitute a ring counter. The output signals of the output terminals Q of the D_DFFs 21, 22, 23, 24, and 25 may be referred to as Q0, Q1, Q2, Q3, and Q4, respectively.

The inverter INV2 outputs an inverted signal of the reset synchronization signal RSTB_SYNC to the frequency dividing unit 20. An inverted signal of the reset synchronization signal RSTB_SYNC is input to the set terminals S of the D_DFF 21 and 22. A signal obtained by further inverting the inverted signal of the reset synchronization signal RSTB_SYNC by the inverter INV3, that is, a signal of the same level as the reset synchronization signal RSTB_SYNC is input to the reset terminal RB of the D_DFFs 23, 24, and 25.

In the initial state, the reset synchronization signal RSTB_SYNC is at a low level. At this time, a high-level signal is input to the set terminals S of the D_DFFs 21 and 22, and a low-level signal is input to the reset terminals RB of the D_DFFs 23, 24, and 25. Accordingly, the levels of the output terminals Q of the D_DFFs 21 and 22 are set to the high level, and the levels of the output terminals Q of the D_DFFs 23, 24 and 25 are reset to the low level. When the reset synchronization signal RSTB_SYNC becomes a high level and the initial state is released (reset release), the frequency dividing unit 20 starts a frequency dividing operation in synchronization with the clock signal CLK. The frequency division number at this time is determined corresponding to the number of the dynamic D flip-flops. In the present embodiment, since the number of the dynamic D flip-flops is five, the frequency division number is five. The output terminal of the frequency dividing circuit DIV may be any of the output terminals Q of the D_DFFs 21, 22, 23, 24, and 25. That is, the frequency dividing circuit DIV outputs one of the output signals Q0, Q1, Q2, Q3, and Q4 as the feedback clock signal FB_CLK.

Figure 3A:
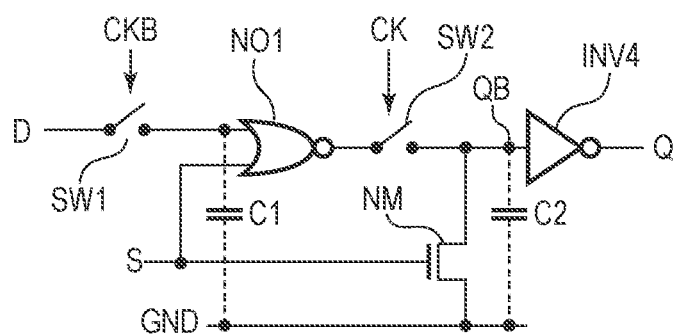
FIGS. 3A and 3B are circuit diagrams of a dynamic D flip-flop according to the first embodiment.
Figure 3B:
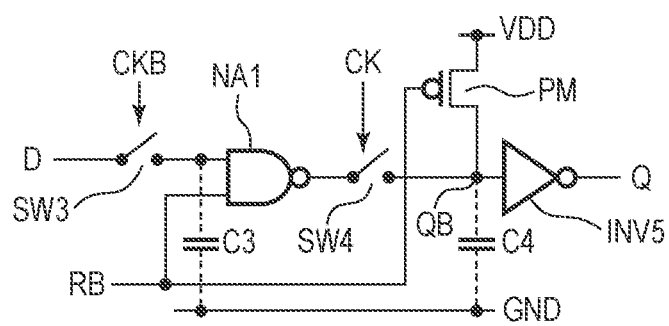

Next, an example of the configuration of the above-described D flip-flop will be described in more detail. FIGS. 3A and 3B are circuit diagrams of the dynamic D flip-flop according to the present embodiment. FIG. 3A is an example of a circuit diagram of the D_DFFs 21 and 22 which are dynamic D flip-flops having the set terminal S. FIG. 3B is an example of a circuit diagram of the D_DFFs 23, 24, and 25, which are dynamic D flip-flops having the reset terminals RB.

First, a configuration example of the D_DFFs 21 and 22 will be described with reference to FIG. 3A. Each of the D_DFFs 21 and 22 includes switches SW1 and SW2, a NOR circuit NO1, an NMOS transistor NM, and an inverter INV4. D, S, Q, and CK in FIG. 3A correspond to the terminals of the D_DFFs 21 and 22 illustrated in FIG. 2. Although not illustrated in FIG. 2, the clock terminal CKB in FIG. 3A is a terminal to which an inverted signal of the clock signal CLK input to the clock terminal CK is input. The switches SW1 and SW2 are turned on when the signals input to the clock terminals CKB and CK are at a high level, respectively.

The input terminal D is connected to a first terminal of the switch SW1. A second terminal of the switch SW1 is connected to a first input terminal of the NOR circuit NO1. The set terminal S is connected to a second input terminal of the NOR circuit NO1 and a gate of the NMOS transistor NM. An output terminal of the NOR circuit NO1 is connected to a first terminal of the switch SW2. A second terminal of the switch SW2 is connected to a drain of the NMOS transistor NM and an input terminal of the inverter INV4. A source of the NMOS transistor NM is connected to a ground line GND having a ground potential. An output terminal of the inverter INV4 is connected to the output terminal Q.

C1 in FIG. 3A represents a parasitic capacitance including a gate capacitance of the first input terminal of the NOR circuit NO1. C2 in FIG. 3A represents a parasitic capacitance including a gate capacitance of the input terminal of the inverter INV4. Although these parasitic capacitances may exist between various nodes, for simplicity of description, these parasitic capacitances are illustrated in FIG. 3A as ground capacitances between corresponding nodes and ground line GND.

In the initial state in which the reset synchronization signal RSTB_SYNC is at the low level, the potential of the set terminal S is at the high level, and the NMOS transistor NM is turned on. At this time, the potential of the input node QB of the inverter INV4 is at the low level, and a high-level signal is output to the output terminal Q.

When the initial state is released, a potential of the node of the set terminal S becomes a low level. Thereafter, when the PLL starts to operate and the clock signal CLK repeats transitions between the high level and the low level, the switches SW1 and SW2 alternately repeat turning on and off. When the state of the switch SW1 changes from off to on, the parasitic capacitance C1 is charged or discharged according to the level of the input terminal D. When the state of the switch SW2 changes from off to on, the parasitic capacitance C2 is charged or discharged according to the level of the output terminal of the NOR circuit NO1.

Next, a configuration example of the D_DFFs 23, 24, and 25 will be described with reference to FIG. 3B. Each of the D_DFFs 23, 24, and 25 includes switches SW3 and SW4, a NAND circuit NA1, a PMOS transistor PM, and an inverter INV5. D, RB, Q, and CK in FIG. 3B correspond to respective terminals of the D_DFFs 23, 24, and 25 illustrated in FIG. 2. Similar to FIG. 3A, the clock terminal CKB is a terminal to which an inverted signal of the clock signal CLK is input. The switches SW3 and SW4 are turned on when the signals input to the clock terminals CKB and CK are at a high level, respectively.

The input terminal D is connected to a first terminal of the switch SW3. A second terminal of the switch SW3 is connected to a first input terminal of the NAND circuit NA1. The reset terminal RB is connected to a second input terminal of the NAND circuit NA1 and a gate of the PMOS transistor PM. An output terminal of the NAND circuit NA1 is connected to a first terminal of the switch SW4. A second terminal of the switch SW4 is connected to a drain of the PMOS transistor PM and an input terminal of the inverter INV5. A source of the PMOS transistor PM is connected to a power supply line VDD having a power supply potential. An output terminal of the inverter INV5 is connected to the output terminal Q.

C3 in FIG. 3B represents a parasitic capacitance including a gate capacitance of the first input terminal of the NAND circuit NA1. C4 in FIG. 3B represents a parasitic capacitance including a gate capacitance of the input terminal of the inverter INV5. These parasitic capacitances are also illustrated as ground capacitances between the corresponding nodes and the ground line GND, as in FIG. 3A.

In the initial state in which the reset synchronization signal RSTB_SYNC is at the low level, the potential of the reset terminal RB is at the low level, and the PMOS transistor PM is turned on. At this time, the potential of the input node QB of the inverter INV5 is at the high level, and a low-level signal is output to the output terminal Q.

When the initial state is released, a potential of the node of the reset terminal RB becomes a high level. Thereafter, when the PLL starts to operate and the clock signal CLK repeats transitions between the high level and the low level, the switches SW3 and SW4 alternately repeat turning on and off. When the state of the switch SW3 changes from off to on, the parasitic capacitance C3 is charged or discharged according to the level of the input terminal D. When the state of the switch SW4 changes from off to on, the parasitic capacitance C4 is charged or discharged according to the level of the output terminal of the NAND circuit NA1.

As described above, each of the D_DFFs 21, 22, 23, 24, and 25, which are dynamic D flip-flops, has a circuit configuration that uses charging and discharging of the parasitic capacitance to hold data. By repeating the transitions between the high level and the low level of the clock signal CLK, the charge and discharge are performed.

Figure 4:
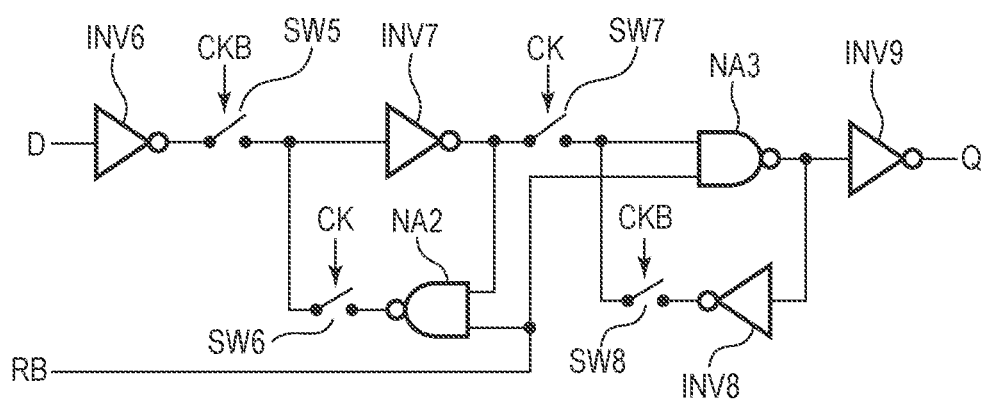
FIG. 4 is a circuit diagram of a static D flip-flop according to the first embodiment.

FIG. 4 is a circuit diagram of a static D flip-flop according to the present embodiment. FIG. 4 is an example of a circuit diagram of ST_DFFs 11, 12, and 13 which are static D flip-flops having reset terminals RB.

Each of ST_DFFs 11, 12, and 13 includes switches SW5, SW6, SW7, and SW8, inverters INV6, INV7, INV8, and INV9, and NAND circuits NA2 and NA3. D, RB, Q, and CK in FIG. 4 correspond to the terminals of the ST_DFFs 11, 12, and 13 illustrated in FIG. 2. Similar to FIG. 3A, the clock terminal CKB is a terminal to which an inverted signal of the clock signal CLK is input. The switches SW6 and SW7 are turned on when the signal input to the clock terminal CK is at a high level. The switches SW5 and SW8 are turned on when the signal input to the clock terminal CKB is at a high level.

The input terminal D is connected to an input terminal of the inverter INV6. An output terminal of the inverter INV6 is connected to a first terminal of the switch SW5. A second terminal of the switch SW5 is connected to an input terminal of the inverter INV7 and a first terminal of the switch SW6. An output terminal of the inverter INV7 is connected to a first terminal of the switch SW7 and a first input terminal of the NAND circuit NA2. An output terminal of the NAND circuit NA2 is connected to a second terminal of the switch SW6. A second terminal of the switch SW7 is connected to a first input terminal of the NAND circuit NA3 and a first input terminal of the switch SW8. The reset terminal RB is connected to a second input terminal of the NAND circuit NA2 and a second input terminal of the NAND circuit NA3. An output terminal of the NAND circuit NA3 is connected to an input terminal of the inverter INV8 and an input terminal of the inverter INV9. An output terminal of the inverter INV8 is connected to a second terminal of the switch SW8. An output terminal of the inverter INV9 is connected to the output terminal Q.

Figure 5A:
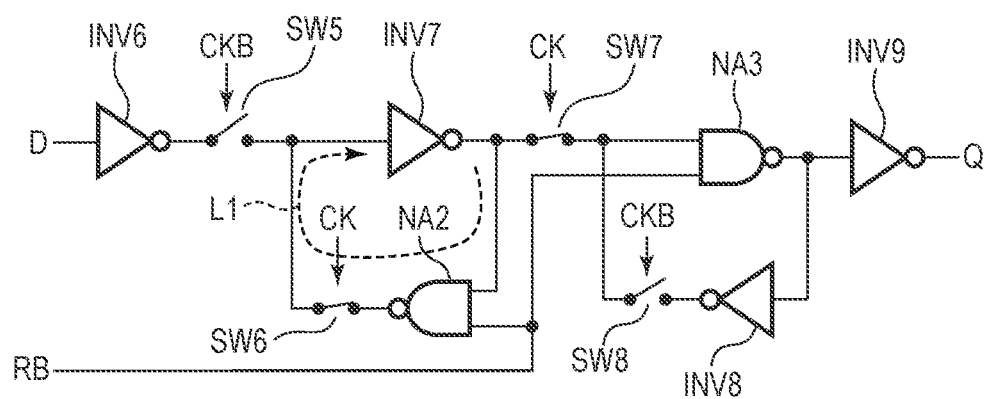
FIGS. 5A and 5B are schematic diagrams illustrating an operation of the static D flip-flop according to the first embodiment.
Figure 5B:
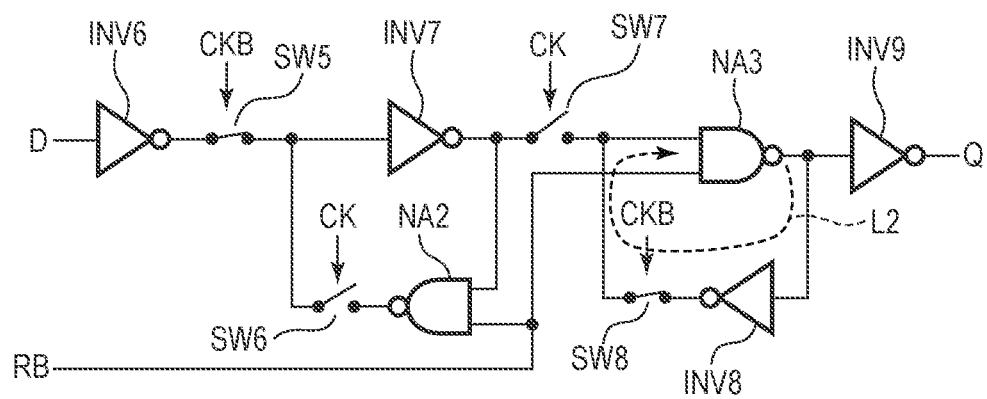

FIGS. 5A and 5B are schematic diagrams illustrating an operation of the static D flip-flop according to the present embodiment. The operation of the static D flip-flop will be described with reference to FIGS. 5A and 5B together with FIG. 4.

In the initial state in which the reset signal RST is at the high level, the potential of the reset terminal RB is at the low level. At this point in time, the clock signal CLK is at a low level. Therefore, the switches SW6 and SW7 are off, and the switches SW5 and SW8 are on. At this time, the output of the NAND circuit NA3 is at a high level, and the output of the inverter INV8 is at a low level. A low-level signal is output to the output terminal Q, which is the output node of the inverter INV9. FIG. 5B schematically illustrates this state. As illustrated in FIG. 5B, in the initial state, the NAND circuit NA3 and the inverter INV8 form a loop L2.

When the initial state is released, the reset signal RST becomes a low level, and the potential of the reset terminal RB becomes a high level. At this point in time, since the low-level potential is supplied from the inverter INV8 to the first input terminal of the NAND circuit NA3, the output of the NAND circuit NA3 is maintained at the high level without varying. Thus, even after the release of the initial state, the initial state data is held by the loop L2.

Thereafter, when the clock signal CLK becomes a high level, the switches SW5 and SW8 are turned off, and the switches SW6 and SW7 are turned on. The potential of the input terminal of the inverter INV7 at this time is a potential obtained by inverting the potential of the input terminal D immediately before the clock signal CLK becomes a high level. When the potential of the input terminal D is at a high level immediately before the clock signal CLK becomes a high level, the potential of the input terminal of the inverter INV7 is at a low level. At this time, the potential of the first input terminal of the NAND circuit NA3 is at a high level, the output of the NAND circuit NA3 is at a low level, and a high-level signal is output to the output terminal Q which is the output node of the inverter INV9. FIG. 5A schematically illustrates this state. As illustrated in FIG. 5A, when the clock signal CLK is at a high level, the NAND circuit NA2 and the inverter INV7 form a loop L1.

Thereafter, when the PLL starts to operate and the clock signal CLK repeats the transitions between the high level and the low level, the state of FIG. 5A in which the loop L1 holds data and the state of FIG. 5B in which the loop L2 holds data are repeated. Thus, the static D flip-flop has a configuration in which loops in a circuit hold data.

Figure 6:
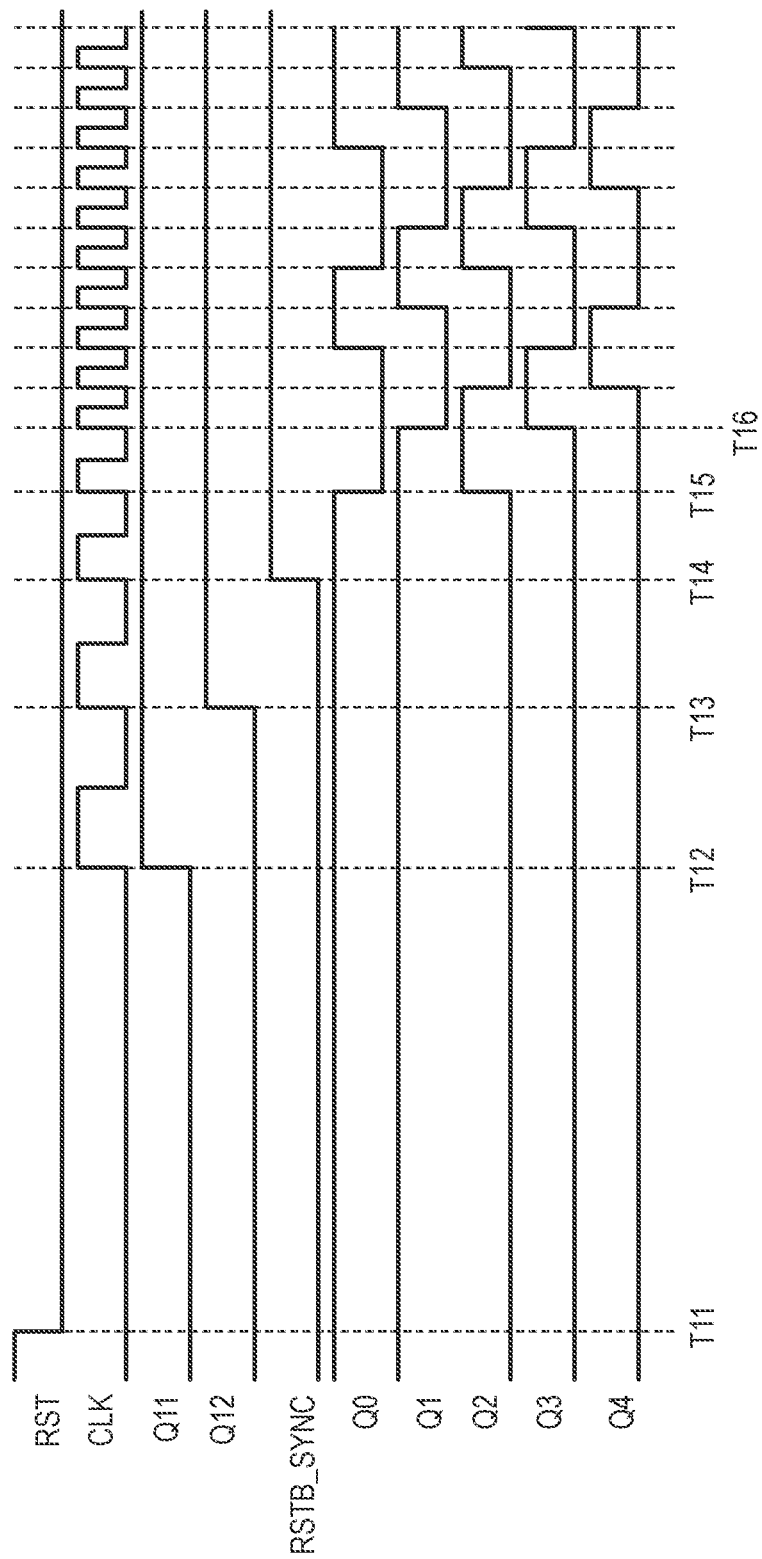
FIG. 6 is a timing chart illustrating an operation of the frequency dividing circuit according to the first embodiment.

Next, the operation of the frequency dividing circuit DIV of the present embodiment will be described. FIG. 6 is a timing chart illustrating the operation of the frequency dividing circuit DIV according to the present embodiment. FIG. 6 illustrates the reset signal RST, the clock signal CLK, the reset synchronization signal RSTB_SYNC, the output signals Q11 and Q12 of the ST_DFFs 11 and 12, and the output signals Q0, Q1, Q2, Q3, and Q4 of the D_DFFs 21, 22, 23, 24, and 25. Note that the frequency dividing circuit DIV is arranged in the PLL illustrated in FIG. 1, and the operation of the PLL may be referred to in the description of the operation of the frequency dividing circuit DIV.

During a period before the time T11, the frequency dividing circuit DIV is in an initial state, and the reset signal RST is at a high level. At this time, the clock signal CLK is at a low level. That is, the reset signal RST and the clock signal CLK are asynchronous at the time when the signals are input to the reset synchronization unit 10. In the initial state, the ST_DFFs 11 and 12 are reset to the initial value, and the output signals Q11 and Q12 are at the low level. The D_DFFs 21 and 22 are set to initial values, and the output signals Q0 and Q1 are at the high level. The D_DFFs 23, 24, and 25 are reset to initial values, and the output signals Q2, Q3, and Q4 are at the low level. In this initial state, the voltage controlled oscillator VCO is also reset and the operation is stopped.

At time T11, reset signal RST changes from the high level to the low level, and the initial state is released. Thus, the high-level signal is input to the reset terminals RB of the ST_DFFs 11, 12, and 13, and the initial state of the reset synchronization unit 10 is released. At this time, the initial state of the PLL is also released, and the operation is started. Accordingly, after time T11, the control voltage VCNT input to the voltage controlled oscillator VCO gradually rises.

The time T12 is a time when the control voltage VCNT rises to such an extent that the voltage controlled oscillator VCO can oscillate. At time T12, the voltage controlled oscillator VCO starts oscillating, and a pulse of the clock signal CLK generated by the voltage controlled oscillator VCO starts to be input to the frequency dividing circuit DIV. At time T12, the clock signal CLK changes from a low level to a high level. In synchronization with this, the output signal Q11 of ST_DFF11 changes from the low level to the high level.

At time T13, the clock signal CLK changes from the low level to the high level. In synchronization with this, the output signal Q12 of ST_DFF12 changes from the low level to the high level.

At time T14, the clock signal CLK changes from the low level to the high level. In synchronization with this, the reset synchronization signal RSTB_SYNC output from the ST_DFF 13 changes from the low level to the high level. At this time, the signals input to the set terminals S of the D_DFFs 21 and 22 of the frequency dividing unit 20 change from the high level to the low level. The signals input to the reset terminals RB of the D_DFFs 23, 24, and 25 of the frequency dividing unit 20 change from the low level to the high level. Thus, the initial state of the frequency dividing unit 20 is released at time T14. After time T14, the frequency dividing unit 20 starts the frequency dividing operation in synchronization with the clock signal CLK.

At time T15, the clock signal CLK changes from the low level to the high level. In synchronization with this, the D_DFFs 21, 22, 23, 24, and 25 output signals of the same level as the output signals of the D_DFFs in the preceding stage. That is, the output signal Q0 changes from the high level to the low level, and the output signal Q2 changes from the low level to the high level. The output signals Q1, Q3, and Q4 maintain the previous state.

At time T16, the clock signal CLK changes from the low level to the high level. In synchronization with this, the D_DFFs 21, 22, 23, 24, and 25 output signals of the same level as the output signals of the D_DFFs in the preceding stage. That is, the output signal Q1 changes from the high level to the low level, and the output signal Q3 changes from the low level to the high level. The output signals Q0, Q2, and Q4 maintain the previous state. Similarly, in synchronization with the rising edge of the clock signal CLK, the D_DFFs 21, 22, 23, 24, and 25 output signals of the same level as the output signals of the D_DFFs in the preceding stage. By repeating such an operation, the D_DFFs 21, 22, 23, 24, and 25 function as a ring counter for counting the clock signal CLK. Then, as illustrated in FIG. 6, the frequency dividing unit 20 divides the frequency of the clock signal CLK and outputs it as a feedback clock signal FB_CLK (any one of the output signals Q0, Q1, Q2, Q3, and Q4).

After time T14, the frequency of the clock signal CLK output from the voltage controlled oscillator VCO gradually rises to a desired frequency with the passage of time. Accordingly, the cycle of the clock signal CLK gradually decreases as illustrated in FIG. 6. In this way, the PLL can generate the clock signal CLK of a desired frequency synchronized with the reference clock signal REF_CLK.

In actuality, the rise of the output signals Q0, Q1, Q2, Q3, and Q4 is delayed by a predetermined time from the rise of the clock signal CLK due to the gate delay. However, this delay is not illustrated in FIG. 6 for simplicity.

The frequency dividing circuit DIV of the present embodiment includes a reset synchronization unit 10 including static D flip-flops. Hereinafter, effects of the reset synchronization unit 10 will be described in comparison with a comparative example.

Figure 7:
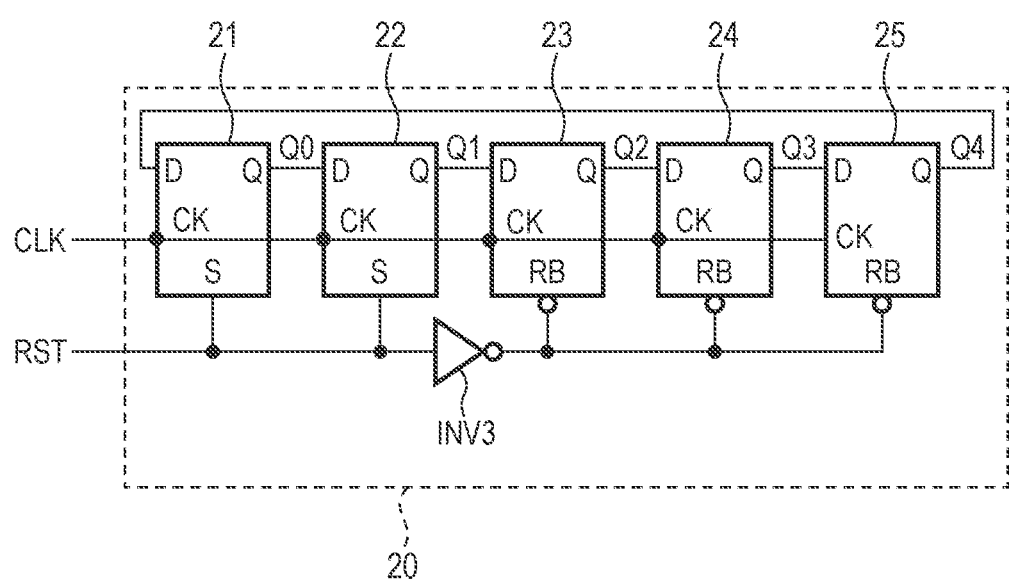
FIG. 7 is a circuit diagram illustrating a configuration of a frequency dividing circuit according to a comparative example.

FIG. 7 is a circuit diagram illustrating a configuration of a frequency dividing circuit DIV according to a comparative example. The frequency dividing circuit DIV illustrated in FIG. 7 differs from the frequency dividing circuit DIV illustrated in FIG. 2 in that the reset synchronization unit 10 and the inverter INV2 are not arranged. As illustrated in FIG. 7, the reset signal RST is directly input to the frequency dividing unit 20. The rest of the configuration is the same as that of the frequency dividing circuit DIV in FIG. 2, so that the description thereof will be omitted.

Figure 8:
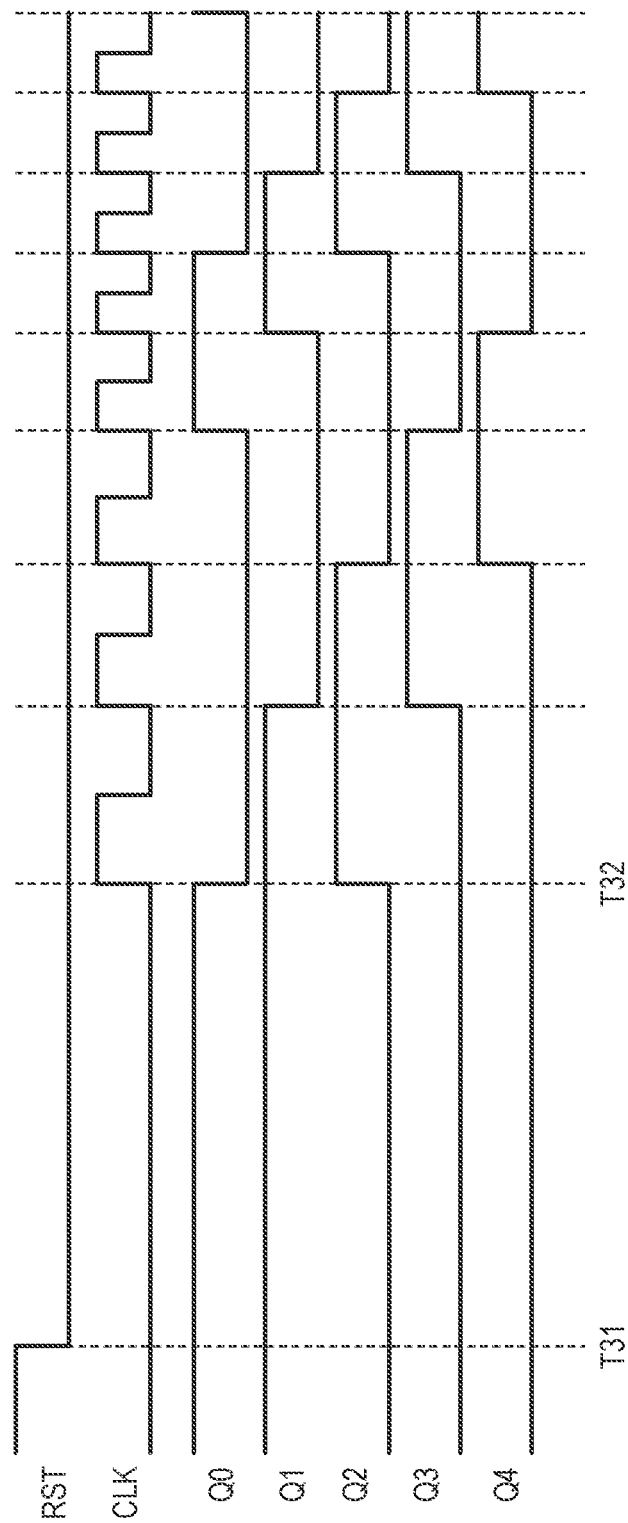
FIG. 8 is a timing chart illustrating an operation of the frequency dividing circuit according to the comparative example.

The operation of the frequency dividing circuit DIV of the comparative example will be described. FIG. 8 is a timing chart illustrating the operation of the frequency dividing circuit DIV according to the comparative example. FIG. 8 illustrates the reset signal RST, the clock signal CLK, and the output signals Q0, Q1, Q2, Q3, and Q4 of the D_DFFs 21, 22, 23, 24, and 25. Note that the frequency dividing circuit DIV is arranged in the PLL illustrated in FIG. 1, and the operation of the PLL may be referred to in the description of the operation of the frequency dividing circuit DIV.

During a period before the time T31, the frequency dividing circuit DIV is in an initial state, and the reset signal RST is at a high level. At this time, the clock signal CLK is at a low level. In the initial state, the D_DFFs 21 and 22 are set to the initial values, and the output signals Q0 and Q1 are at the high level. The D_DFFs 23, 24, and 25 are reset to initial values, and the output signals Q2, Q3, and Q4 are at the low level. In this initial state, the voltage controlled oscillator VCO is also reset and the operation is stopped.

At time T31, reset signal RST changes from the high level to the low level, and the initial state is released. At this time, the signals input to the set terminals S of the D_DFFs 21 and 22 of the frequency dividing unit 20 change from the high level to the low level. The signals input to the reset terminals RB of the D_DFFs 23, 24, and 25 of the frequency dividing unit 20 change from the low level to the high level. Thus, the initial state of the frequency dividing unit 20 is released at time T31. At this time, the initial state of the PLL is also released, and the operation is started. After time T31, the control voltage VCNT input to the voltage controlled oscillator VCO gradually rises.

The time T32 is a time when the control voltage VCNT rises to such an extent that the voltage controlled oscillator VCO can oscillate. At time T32, the voltage controlled oscillator VCO starts oscillating, and a pulse of the clock signal CLK generated by the voltage controlled oscillator VCO starts to be input to the frequency dividing circuit DIV. After time T32, the frequency dividing unit 20 starts the frequency dividing operation in synchronization with the clock signal CLK.

At time T32, the clock signal CLK changes from the low level to the high level. In synchronization with this, the D_DFFs 21, 22, 23, 24, and 25 output signals of the same level as the output signals of the D_DFFs in the preceding stage. That is, the output signal Q0 changes from the high level to the low level, and the output signal Q2 changes from the low level to the high level. The output signals Q1, Q3, and Q4 maintain the previous state. Thereafter, similarly to FIG. 6, the frequency dividing circuit DIV of the comparative example performs an operation of dividing the clock signal CLK.

As described above, when the frequency dividing circuit DIV of the comparative example operates normally as illustrated in FIG. 8, the frequency dividing circuit DIV can perform frequency dividing in the same manner as in FIG. 6. However, the frequency dividing circuit DIV of the comparative example may malfunction. This malfunction will be described.

A dynamic D flip-flop is used as the frequency dividing unit 20 of the frequency dividing circuit DIV of the comparative example. As illustrated in FIGS. 3A and 3B, the dynamic D flip-flop holds data using parasitic capacitances. Therefore, the potential may vary due to influence of leakage of charges. If the level of the clock signal CLK repeats the high level and the low level, charging and discharging are periodically performed, so that such influence of the potential does not cause malfunction. However, if the level of the clock signal CLK is fixed to the high level or the low level for a long time, a data error may occur due to leakage of charges.

Figure 9:
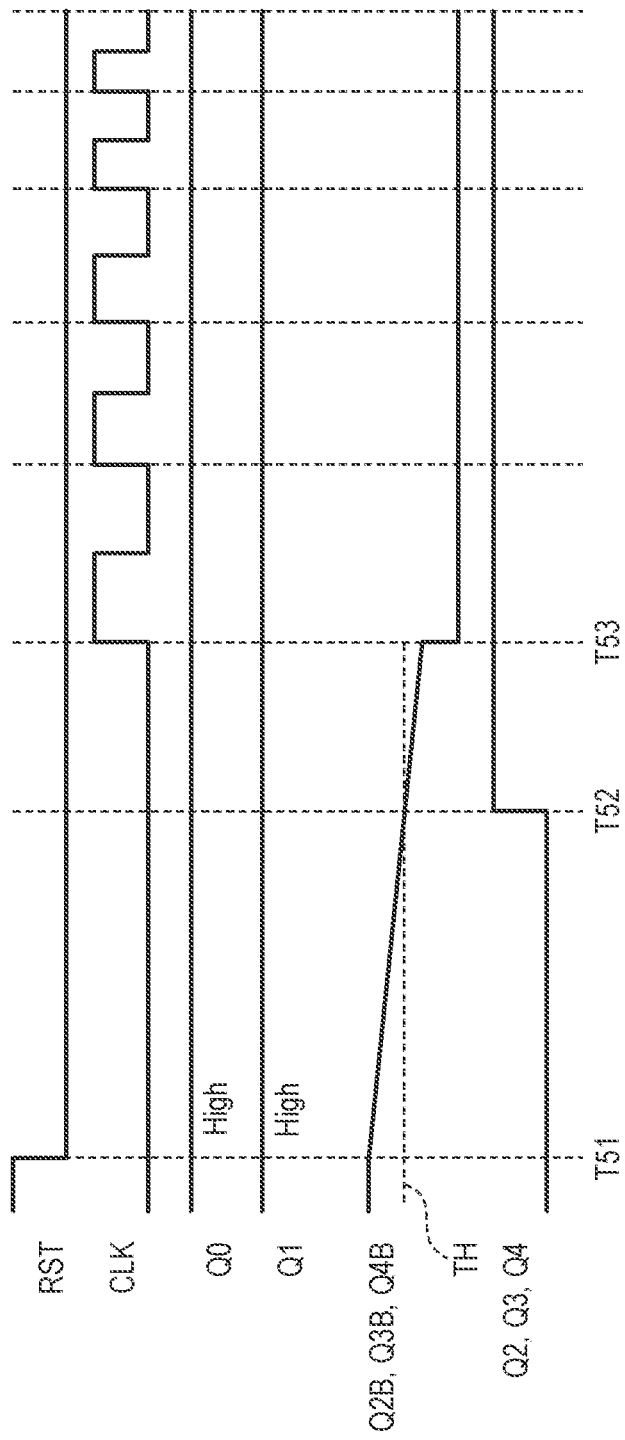
FIG. 9 is a timing chart illustrating malfunction in the frequency dividing circuit according to the comparative example.

FIG. 9 is a timing chart illustrating malfunction in the frequency dividing circuit DIV according to the comparative example. FIG. 9 illustrates a case where malfunction occurs due to leakage of charges in the frequency dividing circuit DIV illustrated in FIG. 7. FIG. 9 illustrates a reset signal RST, a clock signal CLK, output signals Q0, Q1, Q2, Q3, and Q4 of the D_DFFs 21, 22, 23, 24, and 25, and internal signals Q2B, Q3B, and Q4B of the D_DFFs 23, 24, and 25. The internal signals Q2B, Q3B, and Q4B correspond to the level of the input node QB of the inverter INV5 in the D_DFFs 23, 24, and 25 illustrated in FIG. 3B, respectively. Therefore, the internal signals Q2B, Q3B, and Q4B are inverted signals of the output signals Q2, Q3, and Q4.

Time T51 corresponds to the time T31 in FIG. 8. Immediately before time T51, as in FIG. 8, the output signals Q0 and Q1 are at a high level, and the output signals Q2, Q3 and Q4 are at a low level. At this time, the internal signals Q2B, Q3B, and Q4B are at a high level.

At time T51, after the initial state is released, the charges accumulated in the parasitic capacitance C4 illustrated in FIG. 3B are gradually discharged with the passage of time. Therefore, as illustrated in FIG. 9, the potentials of the internal signals Q2B, Q3B, and Q4B gradually decrease with the passage of time. In the D_DFFs 21 and 22, since the level of the input node QB of the inverter INV4 illustrated in FIG. 3A is at a low level, it is assumed that the influence of the leakage of electric charges does not occur, and the description thereof is also omitted in FIG. 9.

At time T52, the potentials of the internal signals Q2B, Q3B, and Q4B become lower than the threshold potential TH of the inverter INV5. Accordingly, the output level of the inverter INV5 is inverted, and the output signals Q2, Q3, and Q4 change from the low level to the high level.

Time T53 corresponds to the time T32 in FIG. 8. At time T53, the voltage controlled oscillator VCO starts oscillating, and a pulse of the clock signal CLK generated by the voltage controlled oscillator VCO starts to be input to the frequency dividing circuit DIV. However, since all of the output signals Q0, Q1, Q2, Q3, and Q4 are at the high level, the output signals Q0, Q1, Q2, Q3, and Q4 continue to maintain the high level even when the pulse of the clock signal CLK is input. Therefore, the frequency dividing circuit DIV cannot perform the frequency dividing operation. Thus, the frequency dividing circuit DIV according to the comparative example may malfunction due to leakage of electric charges.

The operation of the PLL when the frequency dividing circuit DIV malfunctions as described above will be described. The feedback clock signal FB_CLK output from the frequency dividing circuit DIV remains at the high level. At this time, since the phase frequency detector PFD cannot detect the edge of the feedback clock signal FB_CLK, the phase frequency detector PFD controls the charge pump CP to increase the control voltage VCNT. Since the oscillation frequency of the voltage controlled oscillator VCO continues to rise as the control voltage VCNT rises, the PLL is not locked and oscillation at a desired frequency cannot be performed.

As described above, in the case where the frequency dividing circuit DIV is constituted by the frequency dividing unit 20 constituted by the dynamic D flip-flop alone as in the comparative example, malfunction may occur if the period from the release of the initial state to the input of the clock signal CLK is long. Further, a PLL including such a frequency dividing circuit DIV may not be able to oscillate at a desired frequency.

On the other hand, in the present embodiment, the frequency dividing circuit DIV includes the reset synchronization unit 10 including the static D flip-flop. The reset synchronization signal RSTB_SYNC output from the reset synchronization unit 10 becomes the high level in synchronization with the pulse of the clock signal CLK. Therefore, the initial state of the frequency dividing unit 20 is released after the pulse of the clock signal CLK starts to be input. Accordingly, since the period from the release of the initial state to the input of the clock signal CLK in the frequency dividing unit 20 becomes short, the possibility of malfunction caused by charge leakage is reduced. Further, the reset synchronization unit 10 includes the static D flip-flop having a configuration in which data is held in a loop rather than in a parasitic capacitance. Therefore, in the reset synchronization unit 10, even when the period from the release of the initial state to the input of the clock signal CLK is long, the possibility of malfunction is low. Accordingly, the frequency dividing circuit DIV of the present embodiment can reduce malfunction.

Further, when leakage of electric charges occurs in the dynamic D flip-flop, the node may have an intermediate potential. When an intermediate potential is input to a logic gate or the like, a through current flows and power consumption may increase. Further, when the input of the logic gate or the like has an intermediate potential, the circuit operation may become unstable. According to the present embodiment, the influence of an increase in power consumption or instability of circuit operation as described above can also be reduced.

The reduction in malfunction can also be realized by using a static D flip-flop in the frequency dividing unit 20. However, since the dynamic D flip-flop can operate at higher speed than the static D flip-flop in general, it is desirable to use the dynamic D flip-flop in the frequency dividing unit 20 from the viewpoint of speeding up the operation. For example, referring to the inverter INV7 of the static D flip-flop illustrated in FIG. 4, the output terminal of the inverter INV7 is connected to the switch SW7 and the NAND circuit NA2. On the other hand, referring to the NAND circuit NA1 of the dynamic D flip-flop illustrated in FIG. 3B, the output terminal of the NAND circuit NA1 is connected only to the switch SW4. Thus, in the static D flip-flop, each logic gate circuit is connected to many elements in order to form a loop, and the parasitic capacitance driven by each logic gate circuit is large. On the other hand, since no loop is formed in the dynamic D flip-flop, the parasitic capacitance driven by each logic gate circuit is small. Therefore, in general, the dynamic D flip-flop can operate at higher speed than the static D flip-flop. As described above, in the present embodiment, the dynamic D flip-flop is used in the frequency dividing unit 20, thereby realizing high-speed operation.

From the above-described points of view, the frequency dividing circuit DIV of the present embodiment includes a reset synchronization unit 10 including a static D flip-flop and a frequency dividing unit 20 including a dynamic D flip-flop. Thus, both high-speed operation and reduction of malfunction can be achieved. As described above, according to the present embodiment, a logic circuit in which high-speed operation and reduction of malfunction are realized is provided.

In the present embodiment, the reset synchronization unit 10 includes three-stage static D flip-flops, but the reset synchronization unit 10 is not limited thereto, and may be one stage, for example. However, it is desirable that the static D flip-flops included in the reset synchronization unit 10 have a plurality of stages. The reason will be described.

In the PLL of the present embodiment, the frequency of the clock signal CLK immediately after the voltage controlled oscillator VCO starts oscillation is indefinite. Therefore, the interval between the pulses of the clock signal CLK immediately after the voltage controlled oscillator VCO starts oscillation in FIG. 6, that is, the length of the period from the time T12 to the time T13 is also indefinite. Here, when the static D flip-flop included in the reset synchronization unit 10 is one stage, the initial state of the frequency dividing unit 20 is released at time T12 in FIG. 6. However, since the frequency of the clock signal CLK is indefinite, the period between the time T12 and the time T13 (period of the clock signal CLK) may be longer than the period during which the dynamic D flip-flop of the frequency dividing unit 20 can hold the initial value. In such a case, malfunction may occur in the frequency dividing unit 20.

On the other hand, in the present embodiment, since the reset synchronization unit 10 includes a plurality of stages of static D flip-flops, the timing at which the initial state of the frequency dividing unit 20 is released is delayed corresponding to the number of stages of the static D flip-flops. For example, in the example of FIGS. 2 and 6, since the reset synchronization unit 10 includes three-stage static D flip-flops, the initial state of the frequency dividing unit 20 is released at time T14 when the third pulse is input. As a result, the oscillation frequency of the voltage controlled oscillator VCO at the time when the initial state of the frequency dividing unit 20 is released is increased and the cycle of the clock signal CLK can be shortened as compared with the case where the static D flip-flop is provided in one stage. This reduces the possibility of malfunction in the frequency dividing unit 20.

In addition, since a plurality of static D flip-flops in the reset synchronization unit 10 are cascade-connected, the possibility of occurrence of metastable is also reduced. This reduces the possibility of malfunction in the reset synchronization unit 10. As described above, since the static D flip-flop included in the reset synchronization unit 10 has a plurality of stages, the possibility of malfunction in the frequency dividing circuit DIV can be further reduced.

In the present embodiment, the configuration of the frequency dividing unit 20 is not limited to that described above. For example, a circuit other than the ring counter may be used. The number of dynamic D flip-flops is not limited to five, and may be changed as appropriate in accordance with a desired frequency division number. The circuit configuration of the D flip-flop illustrated in FIGS. 3A, 3B, and 4 is an example, and other circuit configurations may be employed. The circuit configuration of the PLL is not limited to that illustrated in FIG. 1.

Second Embodiment

The frequency dividing circuit of the first embodiment and the PLL including the frequency dividing circuit are applicable to, for example, a photoelectric conversion device. In the present embodiment, an example in which the PLL including the frequency dividing circuit of the first embodiment is applied to a photoelectric conversion device will be described.

Figure 10:
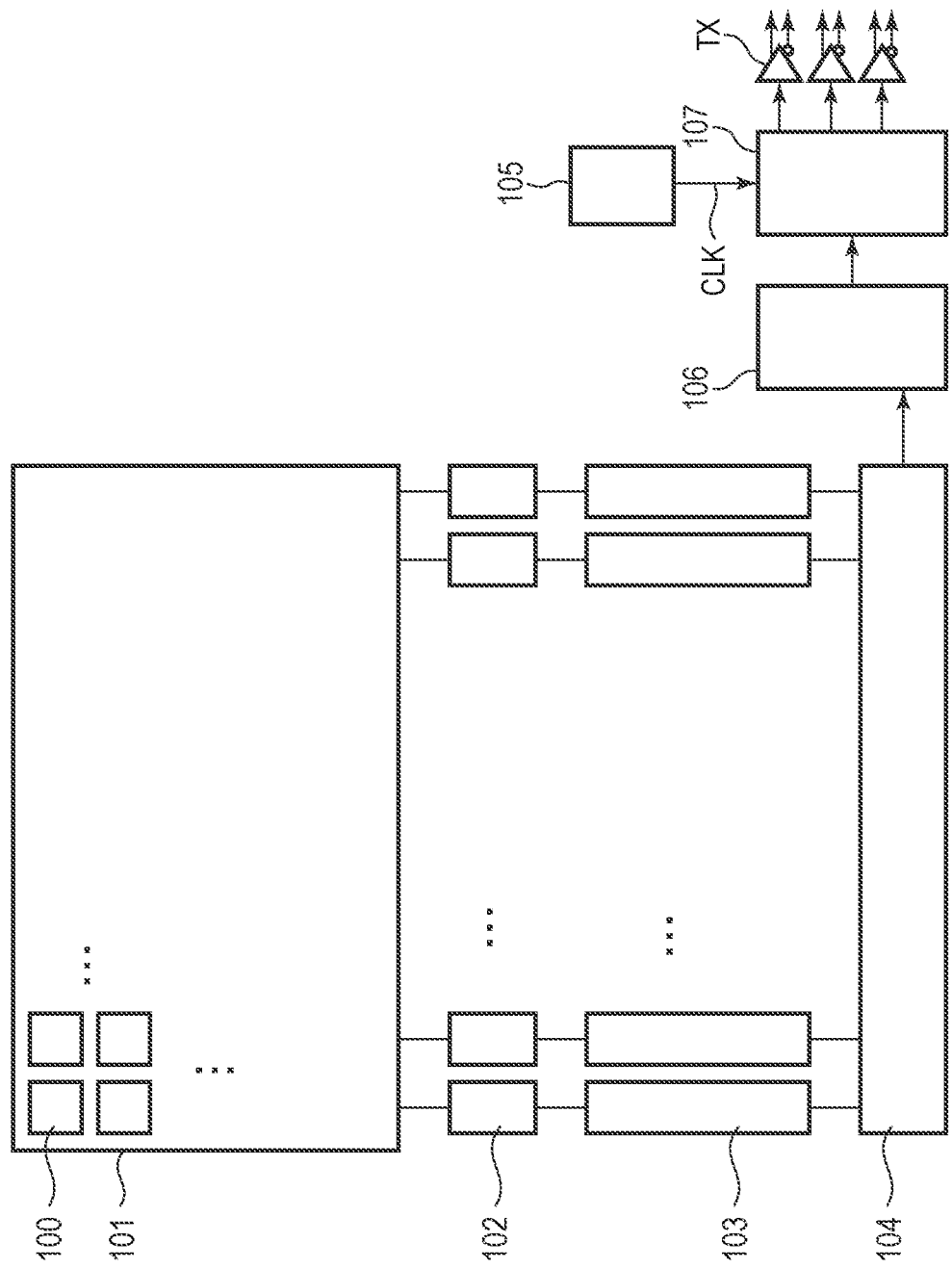
FIG. 10 is a block diagram illustrating a schematic configuration of a photoelectric conversion device according to a second embodiment.

FIG. 10 is a block diagram illustrating a schematic configuration of a photoelectric conversion device according to the present embodiment. The photoelectric conversion device includes a pixel array 101, a column analog-to-digital conversion circuit (hereinafter referred to as a column ADC circuit) 102, a column memory 103, a digital readout circuit 104, a PLL 105, an operation unit 106, a serializer 107, and a transmitter TX. These circuits are formed in a semiconductor substrate. Note that the photoelectric conversion device of the present embodiment is assumed to be an imaging device that acquires an image, but the present invention is not limited to this. For example, the photoelectric conversion device may be a focus detection device, a distance measuring device, a time-of-flight (TOF) camera, or the like.

The pixel array 101 includes a plurality of pixels 100 arranged in a plurality of rows and a plurality of columns and outputting pixel signals corresponding to incident light. Each of the plurality of pixels 100 includes a photoelectric conversion unit that generates and accumulates signal charges based on incident light. The photoelectric conversion unit may be a photodiode. A microlens and a color filter may be arranged on each of the plurality of pixels 100. The plurality of pixels 100 are controlled row basis by a vertical scanning circuit including a shift register, a gate circuit, a buffer circuit, and the like.

The column ADC circuit 102 is arranged corresponding to each column of the plurality of pixels 100, and converts analog signals output from the plurality of pixels 100 into digital data. The converted digital data is stored in the corresponding column memory 103.

The digital readout circuit 104 may include a horizontal scanning circuit, a signal line for reading digital data, and the like. The horizontal scanning circuit includes a shift register, a gate circuit, a buffer circuit, and the like. The horizontal scanning circuit sequentially selects the column memory 103 of each column, and outputs digital data to the operation unit 106 via a signal line.

The operation unit 106 is a signal processing circuit including a digital signal processor. The operation unit 106 performs digital operation processing such as digital gain, digital correlated double sampling, digital offset, and linearity correction on the input digital data, and outputs digital data to the serializer 107. The serializer 107 performs parallel-to-serial conversion on the input digital data and outputs digital data to the transmitter TX. The transmitter TX outputs digital data to the outside of the photoelectric conversion device based on the low voltage differential signaling (LVDS) method or the like.

The PLL 105 is a PLL including the frequency dividing circuit DIV described in the first embodiment. The PLL 105 outputs the clock signal CLK to the serializer 107. The serializer 107 performs parallel-to-serial conversion in synchronization with the clock signal CLK.

The photoelectric conversion device of the present embodiment performs parallel-to-serial conversion based on a clock signal CLK output from a PLL including the frequency dividing circuit DIV described in the first embodiment. Thus, according to the present embodiment, it is possible to provide a photoelectric conversion device in which high-speed operation and reduction of malfunction are realized.

Third Embodiment

Figure 11:
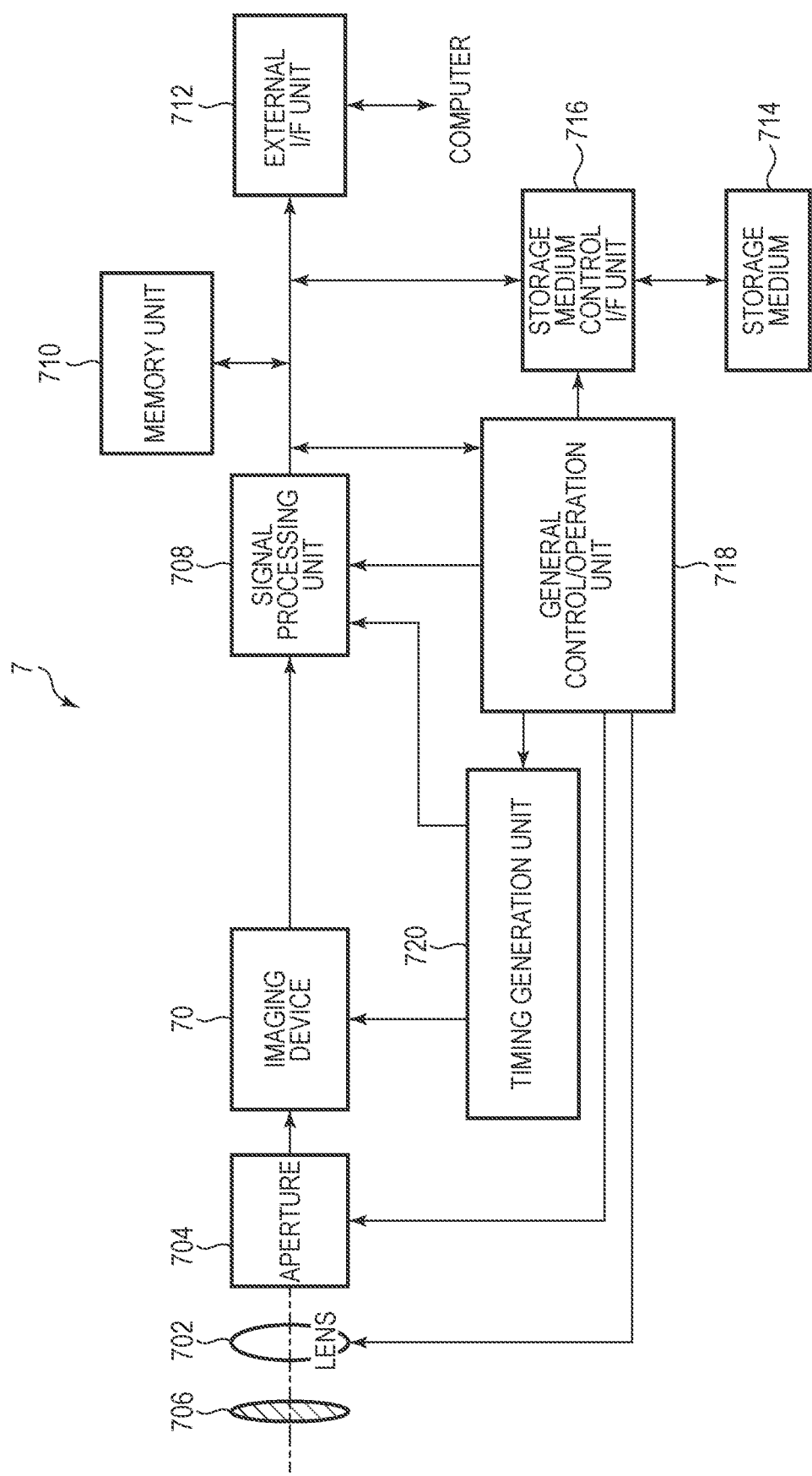
FIG. 11 is a block diagram of equipment according to a third embodiment.

The photoelectric conversion device in the above-described embodiments can be applied to various equipment. Examples of the equipment include a digital still camera, a digital camcorder, a camera head, a copier, a fax machine, a cellular phone, an in-vehicle camera, an observation satellite, a surveillance camera, or the like. FIG. 11 is a block diagram of a digital still camera as an example of equipment.

The equipment 7 illustrated in FIG. 11 includes a barrier 706, a lens 702, an aperture 704, and an imaging device 70 (an example of a photoelectric conversion device). The equipment 7 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the equipment. The barrier 706 protects the lens 702, and the lens 702 forms an optical image of an object on the imaging device 70. The aperture 704 varies the amount of light passing through the lens 702. The imaging device 70 is configured as in the above-described embodiment, and converts an optical image formed by the lens 702 into image data (image signal). Here, it is assumed that an AD (analog-to-digital) conversion unit is formed in the semiconductor substrate of the imaging device 70. The signal processing unit 708 performs various types of correction, data compression, and the like on the imaging data output from the imaging device 70. The timing generation unit 720 outputs various timing signals to the imaging device 70 and the signal processing unit 708. The general control/operation unit 718 controls the overall digital still camera, and the memory unit 710 temporarily stores image data. The storage medium control I/F unit 716 is an interface for storing or reading image data in or from the storage medium 714, and the storage medium 714 is a removable storage medium such as a semiconductor memory for storing or reading image data. The external I/F unit 712 is an interface for communicating with an external computer or the like. The timing signal or the like may be input from the outside of the equipment. Further, the equipment 7 may include a display device (a monitor, an electronic view finder, or the like) for displaying information obtained by the photoelectric conversion device. The equipment includes at least a photoelectric conversion device. Further, the equipment 7 includes at least one of an optical device, a control device, a processing device, a display device, a storage device, and a mechanical device that operates based on information obtained by the photoelectric conversion device. The mechanical device is a movable unit (for example, a robot arm) that operates upon receipt of a signal from the photoelectric conversion device.

In the present embodiment, the imaging device 70 and the AD conversion unit are provided on different semiconductor substrates, but the imaging device 70 and the AD conversion unit may be formed on the same semiconductor substrate. The imaging device 70 and the signal processing unit 708 may be formed on the same semiconductor substrate.

Each pixel may include a plurality of photoelectric conversion units (a first photoelectric conversion unit and a second photoelectric conversion unit). The signal processing unit 708 may be configured to process a pixel signal based on the charges generated in the first photoelectric conversion unit and a pixel signal based on the charges generated in the second photoelectric conversion unit, and acquire the distance information from the imaging device 70 to the object.

Fourth Embodiment

Figure 12A:
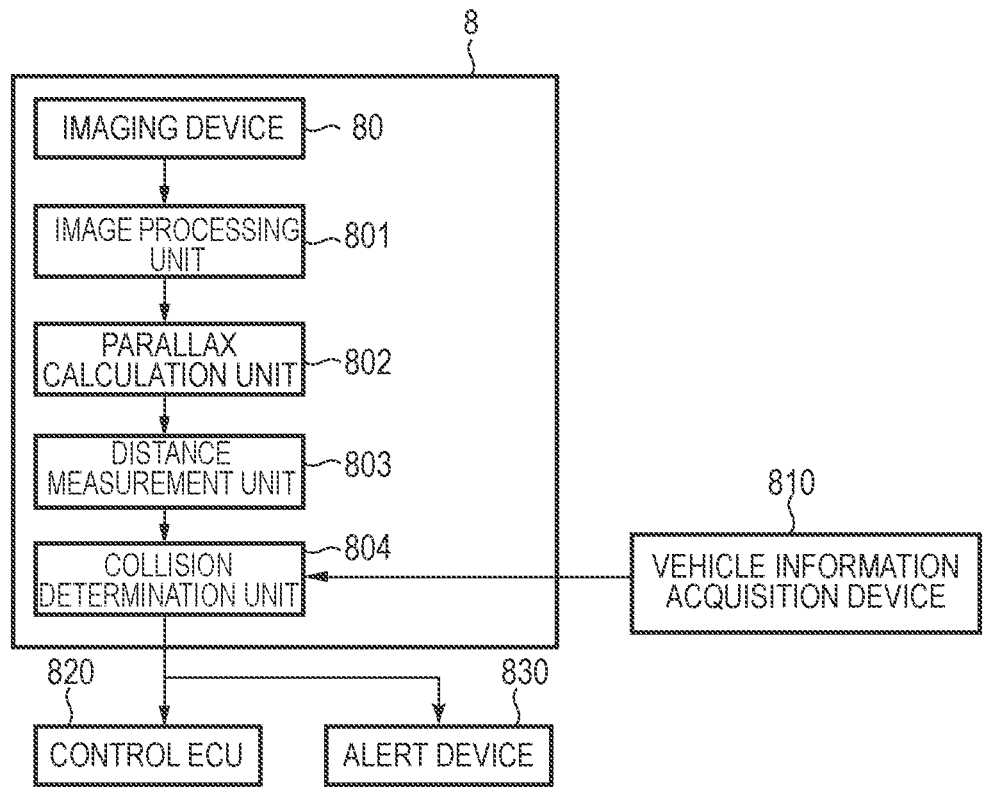
FIGS. 12A and 12B are block diagrams of equipment according to a fourth embodiment.
Figure 12B:
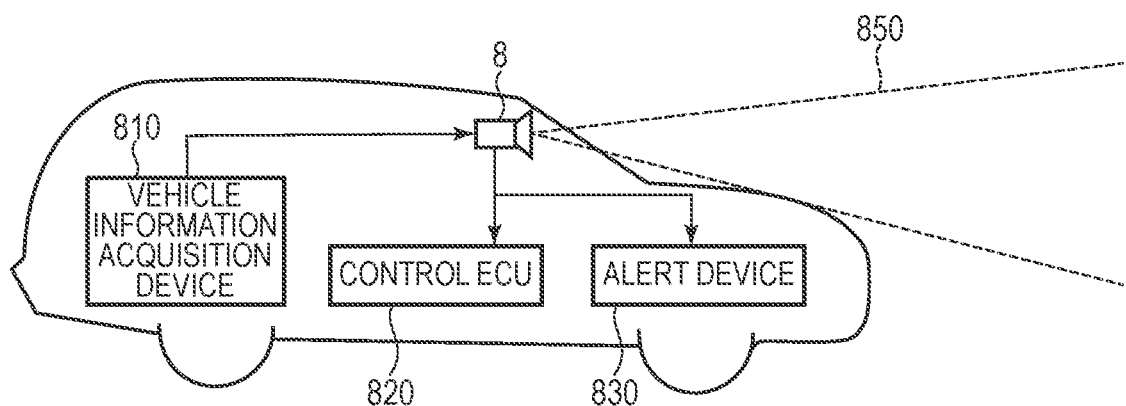

FIGS. 12A and 12B are block diagrams of equipment related to the in-vehicle camera according to the present embodiment. The equipment 8 includes an imaging device 80 (an example of a photoelectric conversion device) and a signal processing device (processing device) for processing a signal from the imaging device 80. The equipment 8 includes an image processing unit 801 that performs image processing on a plurality of image data acquired by the imaging device 80, and a parallax calculation unit 802 that calculates parallax (phase difference of parallax images) from the plurality of image data acquired by the equipment 8. Further, the equipment 8 includes a distance measurement unit 803 that calculates a distance to an object based on the calculated parallax, and a collision determination unit 804 that determines whether or not there is a possibility of collision based on the calculated distance. Here, the parallax calculation unit 802 and the distance measurement unit 803 are an example of a distance information acquisition means that acquires distance information to an object. That is, the distance information is information related to parallax, defocus amount, distance to an object, and the like. The collision determination unit 804 may determine the possibility of collision using any of the distance information. The distance information acquisition means may be realized by dedicatedly designed hardware, or may be realized by a software module. It may be realized by a field programmable gate array (FPGA), an application specific integrated circuit (ASIC) or a combination thereof.

The equipment 8 is connected to the vehicle information acquisition device 810, and can acquire vehicle information such as a vehicle speed, a yaw rate, and a steering angle. A control ECU 820, which is a control device that outputs a control signal for generating braking force to the vehicle based on the determination result of the collision determination unit 804, is connected to the equipment 8. The equipment 8 is also connected to an alert device 830 that issues an alarm to a driver based on the determination result of the collision determination unit 804. For example, when the possibility of collision is high as the determination result of the collision determination unit 804, the control ECU 820 performs vehicle control for avoiding collision or reducing damage by applying a brake, returning an accelerator, suppressing engine output, or the like. The alert device 830 alerts a user by sounding an alert such as a sound, displaying alert information on a screen of a car navigation system or the like, providing vibration to a seat belt or a steering wheel, or the like. The equipment 8 functions as a control means for controlling the operation of controlling a vehicle as described above.

In the present embodiment, an image of the periphery of the vehicle, for example, the front or the rear is captured by the equipment 8. FIG. 12B illustrates equipment when capturing an image of the front of the vehicle (image capturing range 850). The vehicle information acquisition device 810 serving as an imaging control means sends an instruction to the equipment 8 or the imaging device 80 to perform an imaging operation. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Modified Embodiments

The present invention is not limited to the above-described embodiments, and various modifications are possible. For example, an example in which a configuration of a part of any embodiment is added to another embodiment or an example in which a configuration of a part of any embodiment is replaced with a part of another embodiment is also an embodiment of the present invention.

Although the frequency dividing circuit DIV and the PLL including the frequency dividing circuit DIV are explained as an example of the logic circuit in the first embodiment, the present invention is applicable to various logic circuits including dynamic D flip-flops. For example, the present invention is applicable to a serializer and a deserializer, that is, a data conversion circuit that converts one of serial data and parallel data into the other. In this case, a shift register used in the serializer and the deserializer is constituted by a dynamic D flip-flop, and a reset signal is supplied to the shift register from a circuit having the same configuration as that of the reset synchronization unit 10, whereby the present invention can be applied.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-069623, filed Apr. 16, 2021, which is hereby incorporated by reference herein in its entirety.

What is claimed is:

1. A logic circuit comprising:
a first circuit including a static D flip-flop; and
a second circuit including a dynamic D flip-flop, wherein the first circuit receives a clock signal and a first reset signal, wherein the first circuit outputs a second reset signal generated by synchronizing the first reset signal with the clock signal, and wherein the second circuit receives the clock signal and a signal based on the second reset signal.

2. The logic circuit according to claim 1, wherein the first reset signal is asynchronous with the clock signal at a time when the first reset signal is input to the first circuit.

3. The logic circuit according to claim 1, wherein the second circuit includes a ring counter including the dynamic D flip-flop.

4. The logic circuit according to claim 1, wherein the second circuit is a frequency dividing circuit.

5. The logic circuit according to claim 4, wherein the second circuit performs frequency division by a frequency division number corresponding to a number of the dynamic D flip-flops.

6. The logic circuit according to claim 1, wherein the second circuit includes a dynamic D flip-flop having a set terminal and a dynamic D flip-flop having a reset terminal.

7. The logic circuit according to claim 1, wherein the first circuit includes a plurality of the static D flip-flops that are cascade-connected.

8. The logic circuit according to claim 1, wherein an initial state of the first circuit is released based on the first reset signal before a potential of the clock signal starts to vary.

9. The logic circuit according to claim 1, wherein an initial state of the second circuit is released based on the second reset signal after a potential of the clock signal starts to vary.

10. A phase locked loop (PLL) comprising the logic circuit according to claim 1.

11. A data conversion circuit comprising the logic circuit according to claim 1, wherein the data conversion circuit converts one of serial data and parallel data into the other.

12. A photoelectric conversion device comprising the logic circuit according to claim 1.

13. Equipment comprising:

the photoelectric conversion device according to claim 12; and at least any one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

14. The equipment according to claim 13, wherein the processing device processes image signals generated by a plurality of photoelectric conversion units, respectively, and acquires distance information on a distance from the photoelectric conversion device to an object.

* * * * *